United States Patent
Levinzon et al.

(10) Patent No.: US 11,309,855 B2
(45) Date of Patent: Apr. 19, 2022

(54) CHARGE AMPLIFIER CIRCUIT FOR HIGH-TEMPERATURE PIEZOELECTRIC TRANSDUCERS

(71) Applicant: MEGGITT (ORANGE COUNTY), INC., Irvine, CA (US)

(72) Inventors: Felix A. Levinzon, Mission Viejo, CA (US); Margie Mattingly, San Clemente, CA (US)

(73) Assignee: Meggitt (Orange County), Inc., Irvine, CA (US)

( * ) Notice: Subject to any disclaimer, the term of this patent is extended or adjusted under 35 U.S.C. 154(b) by 0 days.

(21) Appl. No.: 16/798,383

(22) Filed: Feb. 23, 2020

(65) Prior Publication Data
US 2021/0250008 A1    Aug. 12, 2021

Related U.S. Application Data
(60) Provisional application No. 62/972,642, filed on Feb. 10, 2020.

(51) Int. Cl.
| | |
|---|---|
| *H03F 3/70* | (2006.01) |
| *H03F 3/185* | (2006.01) |
| *H03F 3/45* | (2006.01) |
| *B06B 1/06* | (2006.01) |
| *G01P 15/09* | (2006.01) |
| *G01H 11/08* | (2006.01) |

(52) U.S. Cl.
CPC ............ *H03F 3/70* (2013.01); *B06B 1/06* (2013.01); *G01H 11/08* (2013.01); *G01P 15/09* (2013.01); *H03F 3/1855* (2013.01); *H03F 3/45071* (2013.01)

(58) Field of Classification Search
CPC ...... H03F 3/70; H03F 3/1855; H03F 3/45071; G01H 11/08; B06B 1/06; G01P 15/09
USPC .................................................. 330/277, 302
See application file for complete search history.

(56) References Cited

U.S. PATENT DOCUMENTS

| | | | |
|---|---|---|---|
| 3,569,747 A | 3/1971 | Siegel | |
| 3,749,946 A | 7/1973 | Von Ruti | |
| 3,947,835 A * | 3/1976 | Laymon | G08B 13/122 340/566 |
| 5,220,836 A | 6/1993 | Harms et al. | |
| 5,792,956 A | 8/1998 | Li | |
| 6,323,730 B1 | 11/2001 | Hynd | |
| 6,987,654 B2 * | 1/2006 | Levinzon | G01H 1/006 361/56 |
| 7,414,466 B2 | 8/2008 | Blumen et al. | |
| 9,411,357 B2 | 8/2016 | Cornu et al. | |

FOREIGN PATENT DOCUMENTS

EP    3312615 A1    4/2018

* cited by examiner

*Primary Examiner* — Hieu P Nguyen
(74) *Attorney, Agent, or Firm* — Hackler Daghighian Martino & Novak (57) ABSTRACT

A circuit has an input and a two-wire output. The circuit is designed for use with HTPE transducers and comprised of four stages. The first stage is a charge amplifier based on operational amplifier, the second stage is a 1-pole passive low-pass filter, the third stage is an active 2-pole low-pass filter based on two JFETs, and the fourth stage is an emitter follower comprising two bipolar junction transistors connected to each other in Darlington configuration.

19 Claims, 6 Drawing Sheets

CHARGE AMPLIFIER CIRCUIT FOR HIGH-TEMPERATURE PIEZOELECTRIC TRANSDUCERS

CROSS-REFERENCE TO RELATED APPLICATION

This patent document claims the benefit of U.S. Provisional Application Ser. No. 62/972,642, filed on Feb. 10, 2020, the contents of which are incorporated herein by reference in their entirety and are to be considered a part of the specification.

FIELD

The present patent document relates to piezoelectric (PE) sensor circuits and generally a way to provide output signal and power to a circuit over the same two wire connection. The present patent document describes two-wire output remote charge amplifier circuits (CAC) designed for a high-temperature, piezoelectric (HTPE) transducers that can operate at temperatures up to +815° C. (+1500° F.).

BACKGROUND

HTPE sensors are used in extremely high temperature environments such as those experienced on aircraft gas turbines. Although many HTPE sensors are used on aircraft, they can be used in the industrial, environmental, military, aviation, and space vehicle fields. A HTPE transducer, like any typical PE transducer, transforms an input signal, like acceleration for example, into an output charge electrical signal. A typical HTPE transducer, similarly to other PE transducers, has a high resistance (typically greater than 100 MΩ) at room temperature, but, in contrast to other PE transducers, exhibits a much lower resistance, down to 10 kΩ at high temperatures.

A remote charge amplifier is used with HTPE transducers to boost the signal. The remote charge amplifier is connected to the HTPE transducer with a high temperature cable. These high temperature cables are often coaxial but other cable types may be used. The charge amplifier converts the charge signal coming from the transducer into a voltage output signal. At the same time, the charge amplifier transforms the transducer's high impedance into the amplifier's low output impedance allowing transmission of the voltage signal over long cable lengths.

In some embodiments, charge amplifiers can be integrated with the transducers such as with IEPE sensors.

The basic advantage of a charge amplifier over a voltage amplifier is that a charge amplifier features independence of a charge gain on the transducer's capacitance. This feature is critical for HTPE transducers because the HTPE transducer is located in a hot zone and connected to the electronic circuit with a high temperature cable having a large capacitance value. Therefore, only a charge amplifier (not a voltage amplifier) can be used as an electronic circuit for HTPE transducers.

Typical charge amplifiers are only able to operate with high impedance capacitive sources. However, when resistance of the signal source decreases due to environmental conditions, a typical charge amplifier generates large spikes in its frequency response. These large spikes in the frequency response occur when the HTPE transducer is exposed to high temperatures. The large spikes are caused because the resistance of the HTPE transducer, which normally has values of hundreds MΩ at room temperature, can decrease to 10 kΩ at temperature of +815° C.

In many embodiments, the charge amplifier is designed to have a two-wire output. The first wire is the actual output and carries the output signal and voltage supply at the same time. The second wire is the ground. The source of power for the circuit may be a constant current source.

Figure 1:
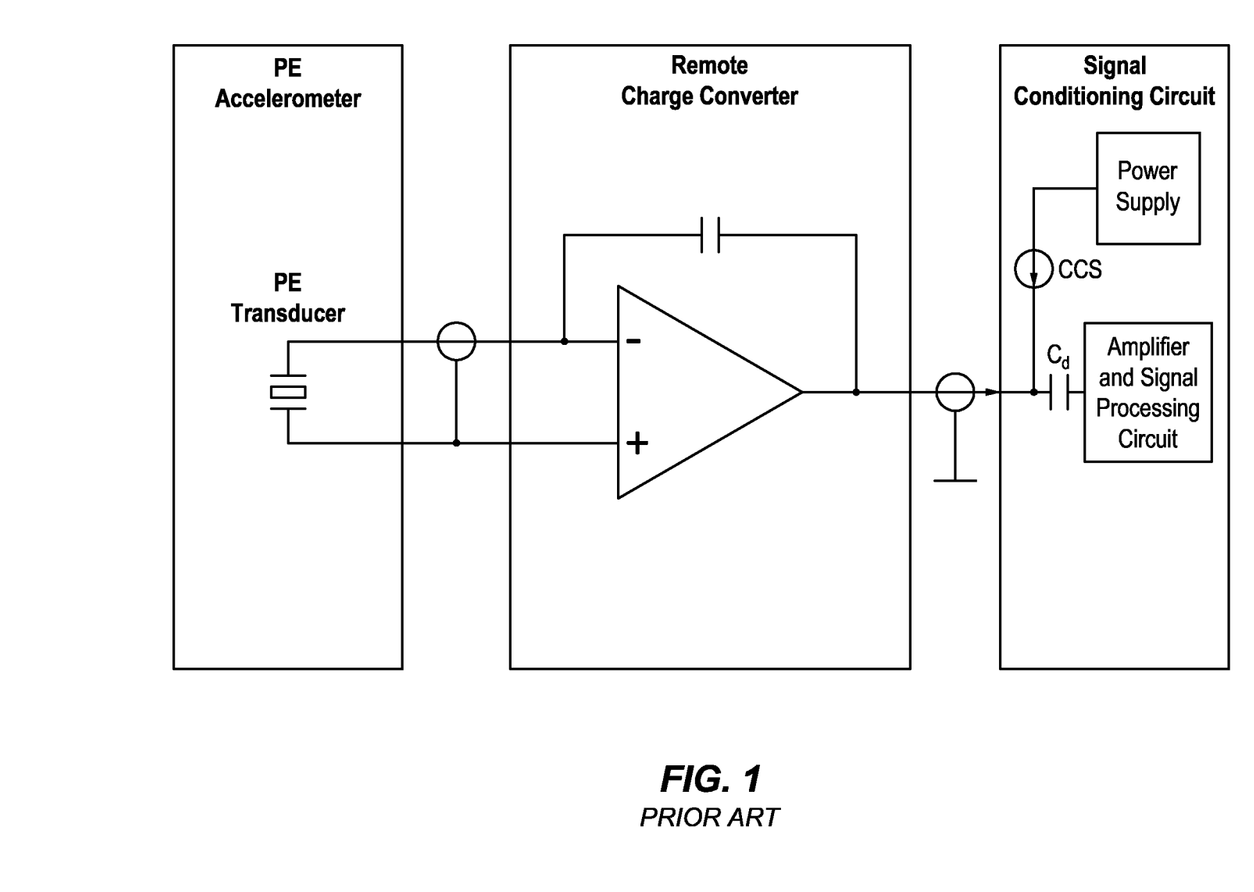
FIG. 1 illustrates a prior art schematic of a charge amplifier circuit based on an Op Amp and used for HTPE transducers.

Various different charge amplifier circuits designed for PE sensors are known in the art. A remote charge amplifier circuit used with a PE sensor is shown in FIG. 1. This charge amplifier is based on an Operational Amplifier ("Op Amp"). In the embodiment shown in FIG. 1, the charge amplifier connects to a PE transducer with a coaxial cable and has a two-wire output. The configuration shown in FIG. 1 may be found at the URL https://www.springer.com/us/book/9783319080772.

Figure 2:
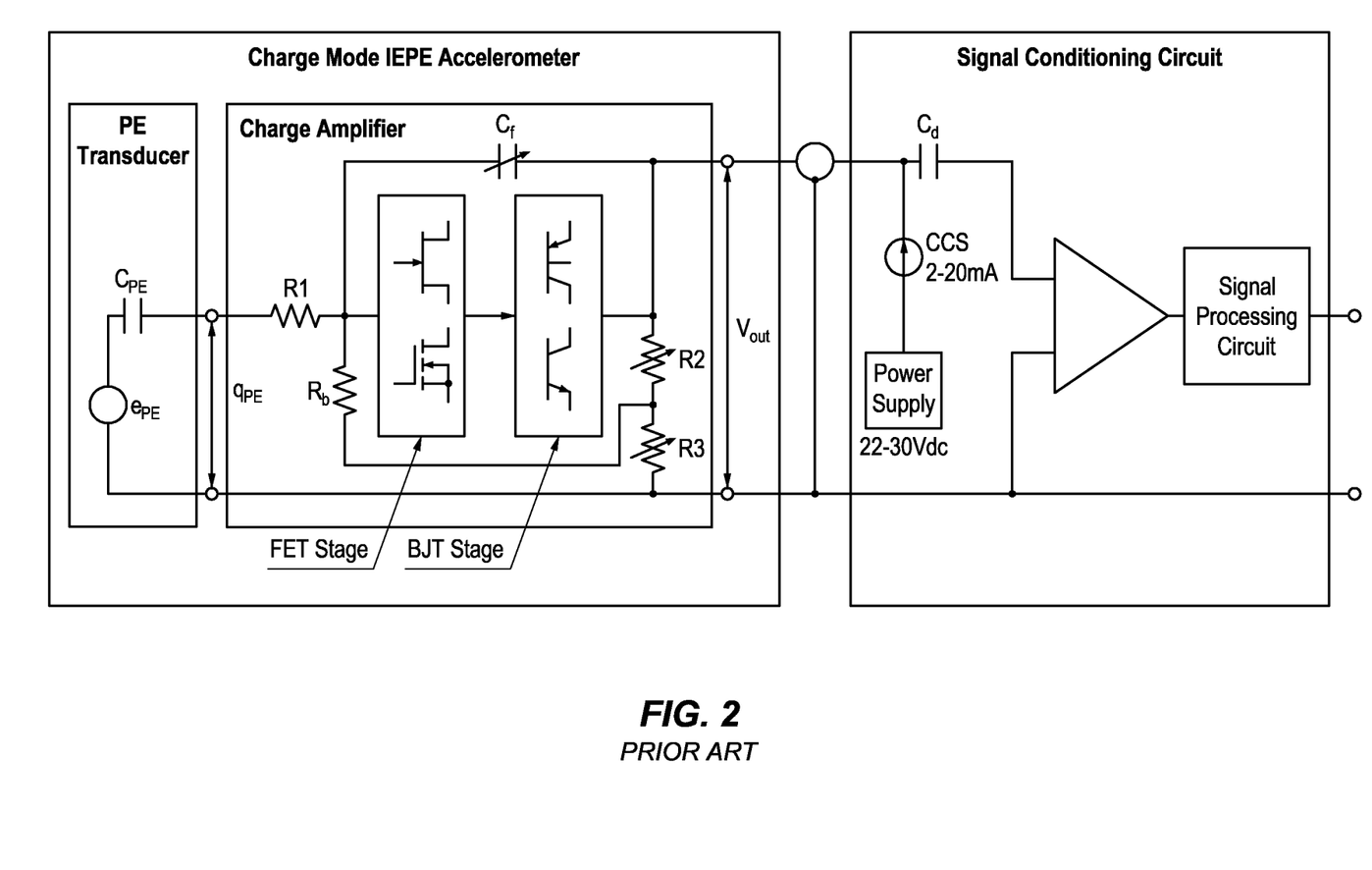
FIG. 2 illustrates a prior art schematic of a charge amplifier based on two-stage FET-BJT transistors and used for IEPE sensors.

Another known configuration for a charge amplifier, and one that is more often used, is illustrated in FIG. 2. The charge amplifier shown in FIG. 2 is two stages and based on a field effect transistor ("FET") and a bipolar junction transistor ("BJT"). The embodiment shown in FIG. 2 may also be found at the URL above. The charge amplifier shown in FIG. 2 also has a two-wire output. However, the charge amplifier in FIG. 2 is part of an IEPE sensor.

In both of the known charge amplifiers shown in FIG. 1 and FIG. 2, only a single 1-pole low-pass filter ("LPF") was used. Moreover, neither of these charge amplifiers can be effectively used with HTPE transducers due to the large spikes in their frequency response that will occur at high temperatures.

To these ends, one object of the present invention is to provide a PE sensor charge amplifier circuit design, and in particular a sensor circuit for an HTPE sensor, that has better performance and can work at high temperatures. Even more preferably, the circuit design would have a two-wire output so that it is compatible with current setups, cabling and sensors designs. Such a design would allow for compatibility with current high-temperature PE sensors hardware and systems while providing for improved performance of these sensors. In particular, it is desirable that the new circuit design could be used as a replacement for current circuits used with HTPE sensors.

SUMMARY OF THE EMBODIMENTS

In view of the foregoing, an object according to one aspect of the present patent document is to provide an improved circuit for sensors and in particular HTPE sensors. In preferred embodiments, the circuit provides extended frequency range for transducers and in particular HTPE transducers. Embodiments described herein preferably have the capability to operate with HTPE transducers even when they have a low impedance due to exposure to high temperatures or other reasons. Preferably, the circuits herein provide resonance suppression to the HTPE transducer's output.

In preferred embodiments, a charge amplifier circuit is provided. In some embodiments, the circuit comprises: an input and a two-wire output; a charge amplifier comprising an operational amplifier and a feedback capacitor; a first low-pass filter directly coupled to an output of the charge amplifier; a second low-pass filter coupled to an output of the first low-pass filter by a decoupling capacitor; a constant current source located between a positive power supply input of the operational amplifier and a first output of the two-wire output wherein the first output of the two-wire output carries the signal and power of the charge amplifier circuit.

In some embodiments, the charge amplifier circuit further comprises an emitter follower directly coupled to an output of the second low-pass filter.

In yet other embodiments, the first low-pass filter is a passive 1-pole low-pass filter. In embodiments with a passive 1-pole low-pass filter, the low-pass filter may be comprised of a resistor and a capacitor.

In preferred embodiments, the second low-pass filter is an active 2-pole low-pass filter. In embodiments that include an active 2-pole low-pass filter, the active 2-pole low-pass filter may comprise two junction field effect transistors (JFET) connected in series with each other, three resistors, and two capacitors.

In preferred embodiments, the charge amplifier circuit may have one or more feedback circuits. In some embodiments, a first feedback circuit provides direct current bias for a non-inverting input of the operational amplifier. In some embodiments, a second feedback circuit provides direct current bias for an inverting input of the operational amplifier. In some embodiments, a third feedback circuit is provided.

Although the charge amplifier circuits taught herein can be used for any purpose, they are ideally suited for use with a piezoelectric transducer and in particular an HTPE transducer. In preferred embodiments, and HTPE is in electrical communication with the input of the charge amplifier circuit.

Embodiments described herein preferably consist of an input and a two-wire output; a first stage including a charge amplifier comprising an operational amplifier (Op Amp), feedback capacitor, and decoupling capacitor; wherein feedback capacitor is connected between the Op Amp output and the circuit input and the decoupling capacitor is connected between the Op Amp inverting input and the circuit input. A second stage including a 1-pole low-pass filter, wherein the output of the first stage is directly coupled to the input of a second stage. A third stage that includes a 2-pole low-pass filter comprising two junction field effect transistors (JFET), three resistors, and two capacitors; wherein the first JFET's drain is connected to the circuit output and the first JFET's source is connected to the second JFET's drain and the input of the emitter follower, the second JFET's gate is connected to the second output wire, and wherein the output of the second stage is connected to the third stage input with a decoupling capacitor in between. A fourth stage including an emitter follower comprising two bipolar junction transistors (BJT) connected to each other as a Darlington transistor. A constant current source (CCS) connected between the first wire of the two-wire output and a positive power supply input of the Op Amp. Three feedback circuits, where the first feedback circuit comprising bipolar junction transistor and two resistors is connected between constant current source and non-inverting input of the Op Amp. A second feedback circuit comprising three resistors is connected between the constant current source and inverting input of the Op Amp. A third feedback circuit comprising three resistors connected between the first wire of the two-wire output and a gate of the first JFET, wherein the collectors of both BJT transistors is electrically connected to a second wire of the two-wire output.

In preferred embodiments, the circuit is used for HTPE transducer and connected to the HTPE transducer with a coaxial cable.

In some embodiments, the fourth stage emitter follower is comprised of two bipolar junction transistors (BJT) connected to each other as a Darlington transistor.

In some embodiments, the third stage 2-pole LPF is comprised of two JFETs connected to each other in series.

In some embodiments, the first feedback circuit is comprised of one BJT and two resistors; each of the second and third feedback circuits is comprised of at least three resistors.

As described more fully below, the charge amplifier circuit of the present patent document addresses and at least ameliorates some of the shortcomings of known charge amplifier circuits used with HTPE transducers. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

The charge amplifier circuit for HTPE transducers described herein contains a unique combination of a charge amplifier with decoupling capacitor, 1-pole passive and 2-pole active low-pass filters, constant current source, and a two-wire output. In preferred embodiments, the charge amplifier circuit further comprises three feedback circuits. The charge amplifier circuit described herein allows the operation of low resistive HTPE transducers at high temperatures. The circuits taught herein provide an increased measuring bandwidth by more effectively suppressing piezoelectric HTPE transducer resonances. Transducer resonance suppression and attenuation of high-frequency signals that can obscure the required low-frequency information and cause saturation of the electronics used in the next stages, are important aspects of the circuits taught herein. All of these advantages are preferably designed in a circuit with a two-wire output, such that it may be designed to be a drop-in replacement for use with existing sensors, equipment and systems.

A HTPE transducer, like any typical PE transducer, transforms an input signal, like an acceleration for example, into an output charge electrical signal. HTPE transducer is essentially a capacitive signal source having high impedance. Sensors/transducers, including HTPE transducers, can be designed to sense any input such as acceleration, rotation, temperature etc. While the circuits described herein were designed for use with accelerometers, the circuits may be used for any type of sensor. In particular, one skilled in the art will recognize that the values of the various components in the circuit can be tuned to adjust the circuit to be effective with many different types of sensors and many different variations of sensors within the same sensor family.

The embodiments herein are comprised of a charge amplifier and are designed for use with HTPE transducers. The circuit makes it possible to measure vibration signals received by HTPE transducers operating at temperatures up to 815° C. (1500° F.) and having resistance ≥10 kΩ. The CAC preferably has a two-wire output and thus, may be connected with a HTPE transducer by a coaxial cable. The CAC design provides transducer resonance suppression, extended frequency range, and makes it possible to operate the HTPE at high temperatures, where low impedance is experienced.

Figure 3:
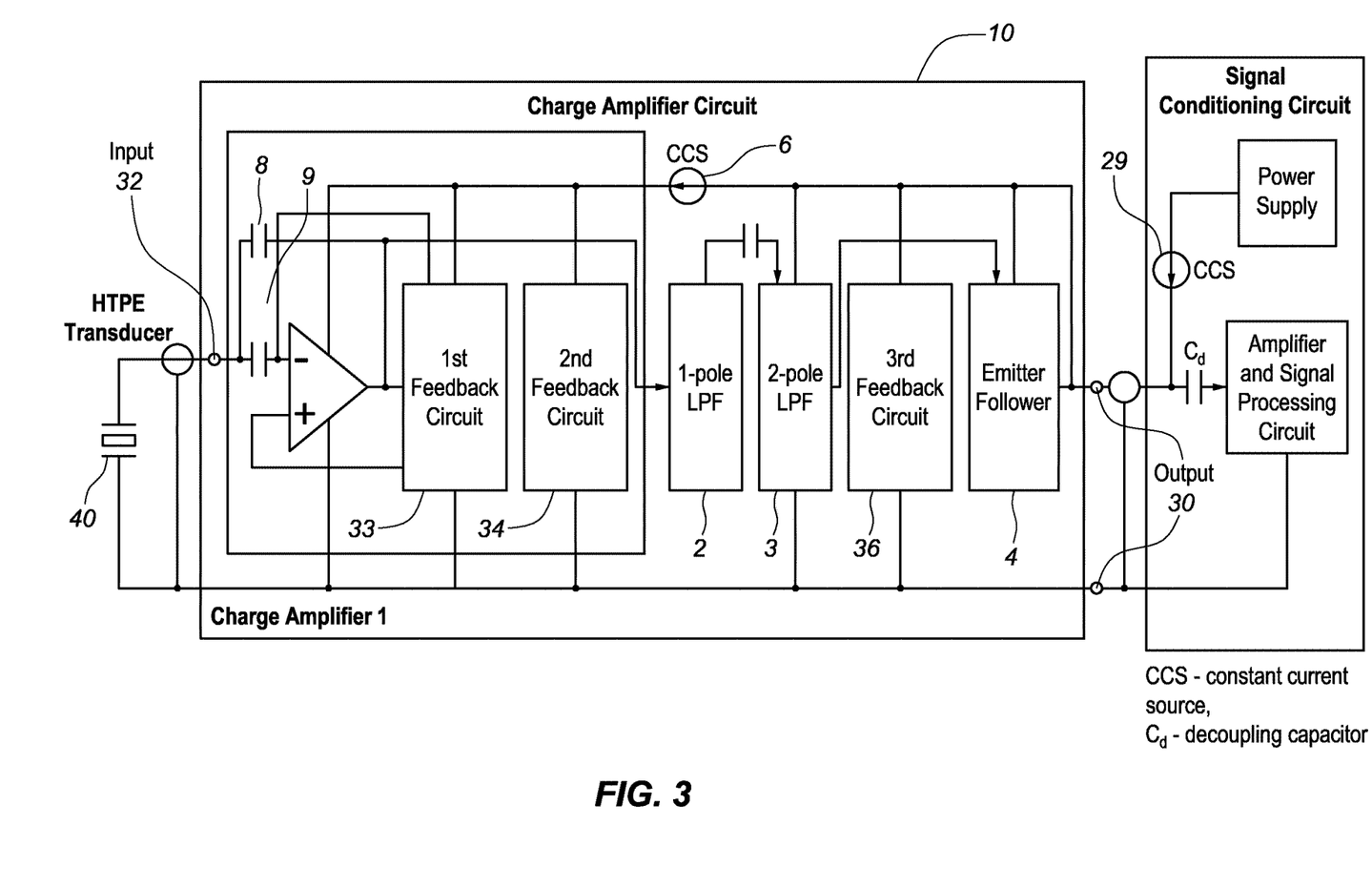
FIG. 3 illustrates a block diagram of the charge amplifier circuit of the present patent document with the signal conditioning circuit and HTPE transducer.

FIG. 3 illustrates a block diagram of the charge amplifier circuit of the present patent document with the signal conditioning circuit and HTPE transducer. As may be seen in FIG. 3, the circuit 10 includes four stages 1, 2, 3, and 4 and has a two-wire output 30.

The first stage is directly coupled to the second stage. The second stage is connected to the third stage with a decoupling capacitor in between, and the third stage is directly coupled to the fourth stage. A constant current voltage supply provides positive voltage supply to the circuit through a constant current source.

Stage 1 includes a charge amplifier. In the embodiments taught herein, the charge amplifier may be any type of charge amplifier. In preferred embodiments, like the one shown in FIG. 3, the charge amplifier is based on an Op Amp.

In the embodiment shown in FIG. 3, a first feedback circuit 33 and a second feedback circuit 34 are present. The feedback circuits 33 and 34 may be constructed in any manner and provided feedback into the charge amplifier in many different ways. In the embodiments shown herein, two feedback circuits are shown. However, in other embodiments, more or less feedback circuits may be used. In some examples, no feedback circuits for the charge amplifier may be used at all. In other embodiments, 1, 2, 3, 4, 5 or more feedback circuits may be used with the charge amplifier.

In the embodiment shown in FIG. 3, stage 2 consists of a single 1-pole low-pass filter ("LPF"). In other embodiments, stage 2 may consist of more than one LPF or may comprise more complicated LPFs. In the embodiment shown in FIG. 3, and preferably for use with HTPE accelerometers, stage 2 consists of a single 1-pole LPF.

In the embodiment shown in FIG. 3, stage 3 consists of an active 2-pole LPF. In other embodiments, stage 3 may consist of more than one LPF or may comprise more or less complicated LPFs. In the embodiment shown in FIG. 3, and preferably for use with HTPE accelerometers, stage 2 consists of a single 1-pole LPF.

The LPFs used in the circuit can increase the bandwidth of the HTPE transducer by as much as double, typically from 5 kHz to 10 kHz at the level −3 dB. The circuit provides HTPE transducer resonance suppression for about 20 dB.

The CAC shown in FIG. 3 has a fourth stage that comprises an emitter follower. As one skilled in the art appreciates, an emitter follower may be constructed in various different ways using various different components. In preferred embodiments, the emitter follower is comprised of two BJT transistors connected in a Darlington schematic.

In a preferred embodiment, a third feedback circuit 36 is used in conjunction with the stage 3.

Finally, not necessarily part of any stage but a crucial component of the circuit, a CCS 6 is provided between the power/signal output wire of the two-wire output and the positive power supply input of the Op Amp 31.

Figure 4:
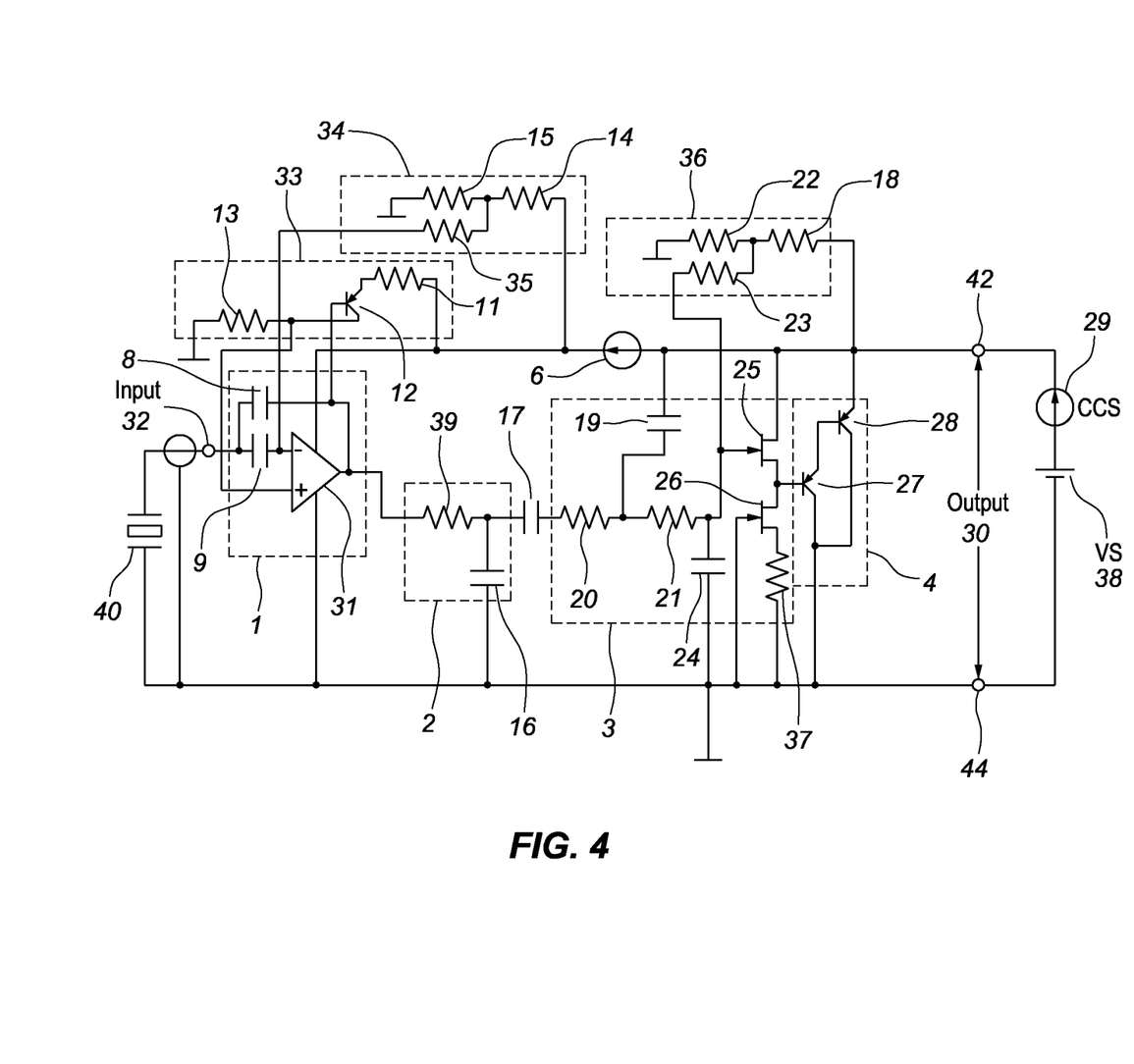
FIG. 4 illustrates a detailed schematic of a charge amplifier circuit design of the present patent document that includes four stages, three feedback circuits, a constant current source, and has a two-wire output.

FIG. 4 illustrates a detailed schematic of a charge amplifier circuit design of the present patent document that includes four stages, three feedback circuits, a constant current source, and has a two-wire output. For clarity, each stage has been depicted by enclosing the stage in dashed lines. Although specific components are shown within the dashed lines of each stage, in other embodiments, other components may be used within each stage or generally within the circuit without departing from the scope of the designs taught herein.

In the embodiment of a circuit 10 illustrated in FIG. 4, the first stage 1 is a charge amplifier. Most charge amplifiers have the input stage based on a Field Effect Transistor (FET) and the output stage based on a Bipolar Junction Transistor (BJT). In other embodiments, the charge amplifier is based on an Op Amp. In the embodiment shown in FIG. 4, the charge amplifier is based on the Op Amp 31 with a FET in the input stage.

The input charge signal comes from PE transducer 40 to the input 32 of the charge amplifier 1. The signal passes through a decoupling capacitor 9 and then goes into the inverting input of the Op Amp 31. The Op Amp 31 output signal goes back into its inverting input through the negative feedback capacitor 8 and decoupling capacitor 9. The feedback capacitor 8 is connected between the Op Amp 31 output and the circuit input 32 and the decoupling capacitor 9 is connected between an Op Amp 31 inverting input and the circuit input 32.

The value of feedback capacitor 8 determines the charge amplifier 1 gain. The gain depends only on the feedback capacitance 8; it is not affected by the cable capacitance or the internal capacitance of the sensor. The charge amplifier 1 provides amplification of a charge signal and transforms the charge signal into a voltage signal at its output.

The embodiments shown in FIGS. 3 and 4 both contain a first feedback circuit 33. In the embodiment shown in FIG. 4, the feedback circuit comprises a BJT 12 and two resistors 11 and 13. In other embodiments, other components may be used to create first feedback circuit 33. First feedback circuit 33 provides direct current ("DC") bias for the non-inverting input of Op Amp 31. First feedback circuit 33 provides the stability of the charge amplifier 1 over a specified temperature range, typically from −10° C. to +100° C. As may be appreciated, the values of the components of the first feedback circuit 33 may be tuned for a specific temperature range and for use with a specific charge amplifier 1.

The embodiments shown in FIGS. 3 and 4 also both contain a second feedback circuit 34. The second feedback circuit 34 comprises three resistors 14, 15 and 35 and provides DC bias for the inverting input of Op Amp 31 and also stable operation of the charge amplifier 1. Similar to the first feedback circuit 33, other components may be used to create second feedback circuit 34 and the values of the components of the second feedback circuit 34 may be tuned for to achieve a specific performance or for use with a specific charge amplifier 1.

In the embodiments shown in FIGS. 3 and 4, the Op Amp 31 is connected to two feedback circuits 33 and 34. However, in other embodiments, fewer or more feedback circuits may be incorporated. In some embodiments, a single feedback circuit may be used. In other embodiments, more than two feedback circuits may be used with charge amplifier 1.

After leaving the charge amplifier 1, the voltage signal, which is at the output of the charge amplifier 1, goes to the second stage 2. In the embodiments shown in FIGS. 3 and 4, the second stage 2 is a 1-pole passive LPF. As one skilled in the art will appreciate, there are many ways to construct an LPF and generally, any LPF may be used as stage 2. In the embodiments shown in FIGS. 3 and 4, the stage 2 LPF is a 1-pole LPF comprised of resistor 39 and capacitor 16. The purpose of the stage 2 1-pole LPF is to provide attenuation of the signal at the frequencies located near the PE transducer's resonance frequency.

The signal from the second stage 2 continues on to the third stage 3 through a decoupling capacitor 17. In the embodiments shown in FIGS. 3 and 4, the third stage 3 is a 2-pole active LPF. As one skilled in the art will appreciate, there are many ways to construct an LPF and generally, any LPF may be used as stage 3. In the embodiments shown in FIGS. 3 and 4, the stage 3 LPF is a 2-pole active LPF comprised of a voltage mode source follower based on two JFET transistors 25 and 26 connected in series with each other.

In the embodiments shown herein, the two (JFET) transistors 25 and 26 are connected in series with each other wherein the first JFET's drain is connected to the circuit output and the first JFET's source is connected to the second JFET's drain and the input of the fourth stage emitter follower. The second JFET's gate is connected to the second output wire and the second JFET's source is connected to the second output wire with resistor 37 in between.

The stage 3 2-pole LPF further includes two resistors 20 and 21 and two capacitors 19 and 24. The stage 3 schematic used herein for an LPF corresponds to a 2-pole active LPF Sallen-Key configuration. As may be appreciated, other types of LPF's may be used for stage 3. The configuration of the 2-pole LPF shown in stage 3 is advantageous at least because it has a voltage gain of about 1 and features a small power current consumption (less than 1 mA). LPF's with similar gain and power consumption characteristics may be used in other embodiments.

The purpose of the third stage 3 2-pole active LPF is to provide additional attenuation of the signal at the frequencies located in the PE transducer's resonance area. As may be appreciated LPFs with different performance characteristics may be used to notch out different resonances and achieve different frequency responses. Moreover, the values of the components may be varied to match a particular resonance. Additional LPF filters may also be used in other embodiments to create more sophisticated resonance suppression.

In some embodiments of the CAC 10, a single 1-pole filter may be used, i.e. just a stage 2. A single 1-pole LPF design can be acceptable in some sensor applications. In a design with HTPE transducers, it is desirable to have more roll-off at frequencies close to the PE transducer's resonance to provide extension of the frequency range at these frequencies. Accordingly, for the HTPE applications, it is advantageous to have a CAC that provides more PE resonance suppression, resulting in extending frequency range, while still allowing for a two-wire output and capability of operation with low resistance HTPE transducers at high temperatures.

In the embodiments shown in FIGS. 3 and 4, a third feedback circuit 36 is provided. The third feedback circuit 36, comprises three resistors 18, 22, and 23. The third feedback circuit is connected between the first wire of the two-wire output and a gate of the first JFET, The third feedback circuit 36 provides DC bias for the JFETs 25 and 26 and stable operation over a specified temperature range. In other embodiments, the third feedback circuit may have other designs and use other components. In addition, the values of the resistors may be varied to support different applications.

The signal from the third stage 3 LPF continues on to the fourth stage 4, which is an emitter follower. The emitter follower provides low output impedance for the circuit 10. In the embodiments taught herein, stage 4 is comprised of the two BJT transistors connected in a Darlington transistor configuration, wherein collectors of both BJT transistors are electrically connected to a second wire of the two-wire output. Designing stage 4 in a Darlington transistor configuration allows for lower output impedance, in comparison to the single BJT.

In addition to the stages described above, the CAC 10 includes a couple additional components. In the embodiments shown in FIGS. 3 and 4, a decoupling capacitor 17 is placed between the second stage 2 LPF and third stage 3 LPF. In other embodiments, the decoupling capacitor 17 may be placed in other locations or more than one decoupling capacitor 17 may be used.

The CAC 10 illustrated in FIGS. 3 and 4 also includes a constant current source ("CCS") located between the output of the two-wire output with the power and signal and the positive power supply input of the Op Amp 31. It is critical for the proper function of the CAC 10 that the CCS 6 is included.

In operation, power is supplied to the circuit 10 by the positive constant voltage supply 38 connected to the circuit 10 though the CCS 29. An input charge signal from HTPE transducer 40 is received by the circuit input 32, amplified and transformed into an output voltage signal by the charge amplifier 1. The voltage signal then passed through the 1-pole passive LPF 2 and the 2-pole active LPF 3. A signal is effectively attenuated by these LPFs at high-frequencies located in the area of the resonance of the HTPE transducer 40. Attenuation of these high frequencies compensates the rise in frequency response caused by the resonance of the HTPE transducer 40. As a result, the circuit 10 provides effective HTPE transducer 1 resonance suppression, resulting in extension of a flat area of a frequency range that increases measuring bandwidth.

The output of the CAC 10 is a two-wire output with the first output wire 42 carrying both the power and signal and the second output wire 44 being ground. The two-wire output allows the embodiments disclosed herein to transmit a low output impedance voltage through the same coaxial cable and BNC connector that typically supplies the constant current power in currently existing sensor applications.

The design of the CAC's herein with charge amplifier 1 having decoupling capacitor 9 and two feedback circuits 33 and 34 can be used to provide a flatter frequency response for HTPE transducers over a specified frequency range, typically from 3 Hz to 10 kHz at the level of ±3 dB. This may be contrasted with the frequency response of a HTPE transducer used with existing charge amplifier circuits, which typically has an upper end frequency response not more than 5 kHz at the same level of ±3 dB.

Figure 5:
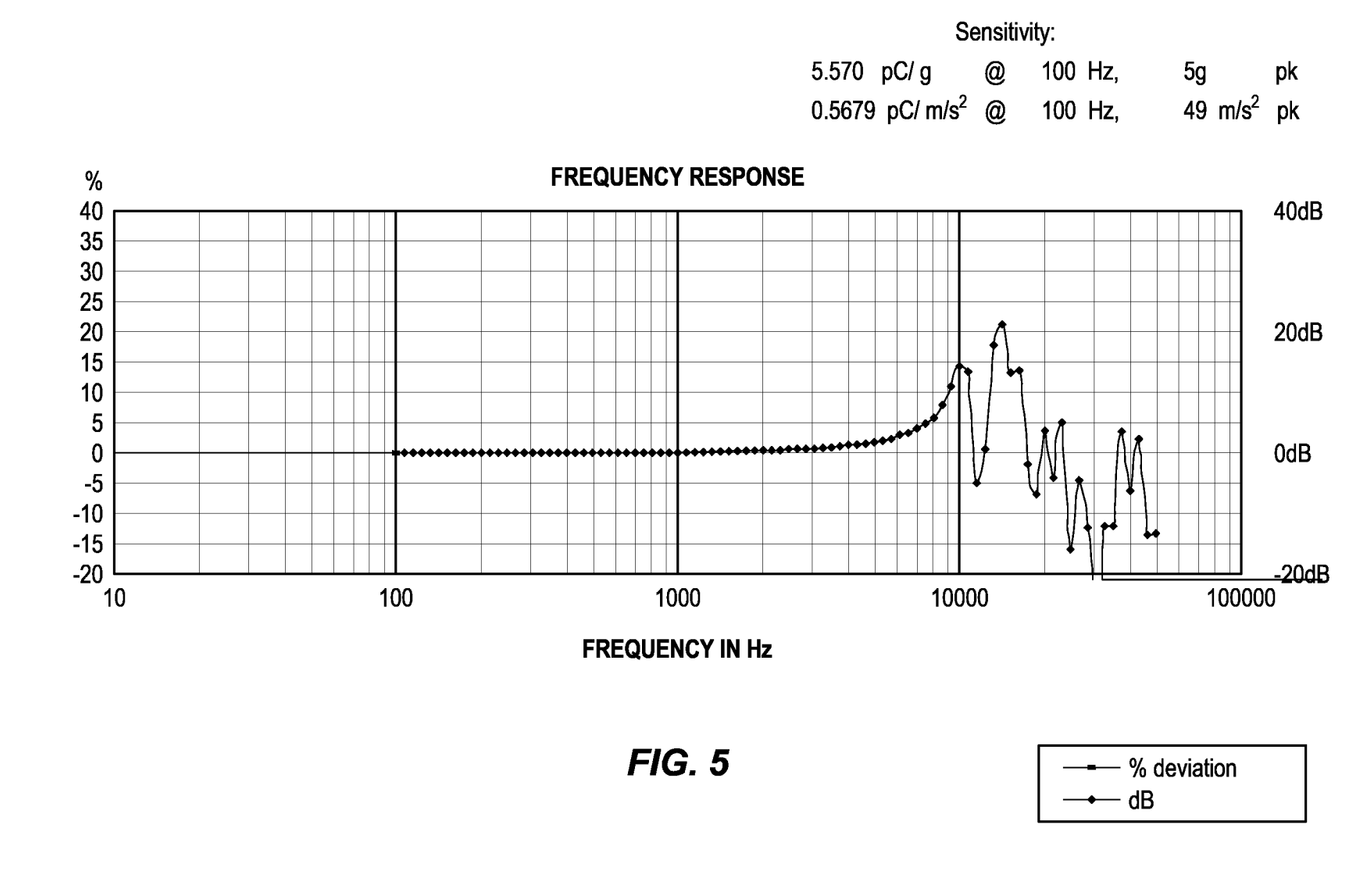
FIG. 5 illustrates a typical frequency response for a HTPE transducer operating with the charge amplifier circuit belonging to the prior art.

FIG. 5 illustrates a typical frequency response for a HTPE transducer operating with the charge amplifier circuit belonging to the prior art. As may be appreciated by looking at the plot, the frequency response of the HTPE transducer is ±3 dB at around 4-5 kHz.

Figure 6:
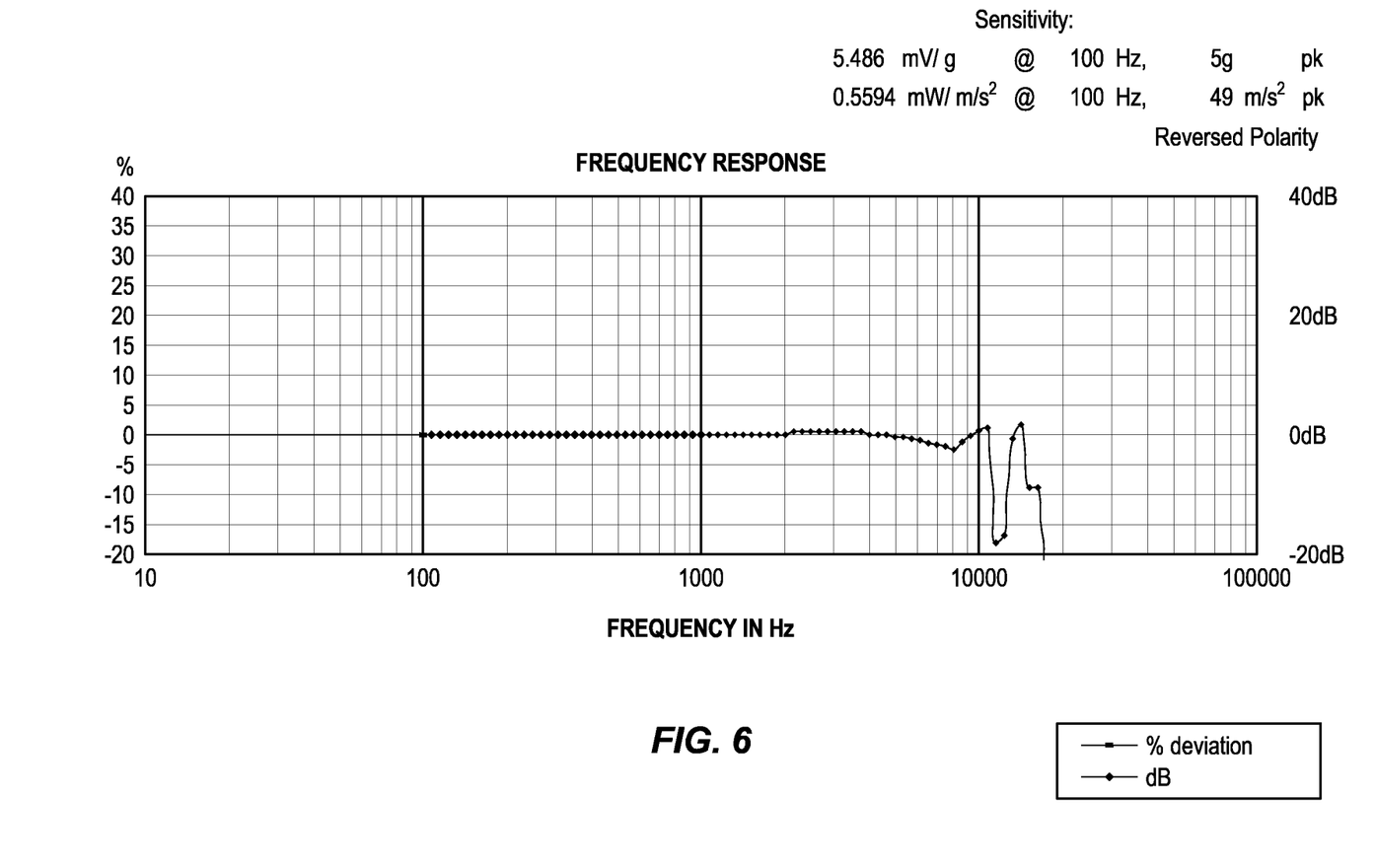
FIG. 6 illustrates a typical frequency response for a HTPE transducer operating with the charge amplifier circuit described in the present patent document.

FIG. 6 illustrates a typical frequency response for a HTPE transducer operating with the charge amplifier circuit described in the present patent document. As may be appreciated by looking at the plot in FIG. 6, the frequency response of the HTPE transducer doesn't reach ±3 dB until close to around 8-10 kHz. Moreover, the frequency response is still less than ±3 dB at 11 khz. Accordingly, it can be seen that the circuit 10 provides about 2 times more frequency range, from 5 kHz to 10 kHz at the level of ±3 dB and a HTPE transducer resonance suppression for about 20 dB, in comparison to the prior art.

The charge amplifier circuit 10 described in the present patent document makes it possible to use HTPE transducers to make measurements over almost twice the frequency band over typical HTPE setups. The CAC's taught herein provide HTPE resonance suppression of about 20 dB, allowing operation of HTPE transducers having low resistance at high temperatures and keeping a two-wire output configuration.

What is claimed is:

1. A charge amplifier circuit comprising:
an input and a two-wire output;
a charge amplifier comprising an operational amplifier and a feedback capacitor;
a first low-pass filter directly coupled to an output of the charge amplifier;
a second low-pass filter coupled to an output of the first low-pass filter by a decoupling capacitor;
a constant current source located between a positive power supply input of the operational amplifier and a first output of the two-wire output wherein the first output of the two-wire output carries signal and power for the charge amplifier circuit; and
a first feedback circuit that provides direct current bias for a non-inverting input of the operational amplifier.

2. The charge amplifier circuit of claim 1 further comprising an emitter follower directly coupled to an output of the second low-pass filter.

3. The charge amplifier circuit of claim 1, wherein the first low-pass filter is a passive 1-pole low-pass filter.

4. The charge amplifier circuit of claim 3, wherein the first low-pass filter comprises a resistor and a capacitor.

5. The charge amplifier circuit of claim 1, wherein the second low-pass filter is an active 2-pole low-pass filter.

6. The charge amplifier circuit of claim 5, wherein the second low-pass filter comprises two junction field effect transistors (JFET) connected in series with each other, three resistors, and two capacitors.

7. The charge amplifier circuit of claim 1, further comprising a second feedback circuit that provides direct current bias for an inverting input of the operational amplifier.

8. The charge amplifier circuit of claim 1, wherein a piezoelectric transducer is in electrical communication with the input of the charge amplifier circuit.

9. A charge amplifier circuit comprising:
an input and a two-wire output;
a charge amplifier comprising an operational amplifier and a feedback capacitor;
a first low-pass filter in electrical communication with an output of the charge amplifier;
a second low-pass filter in electrical communication with an output of the first low-pass filter;
an emitter follower in electrical communication with an output of the second low-pass filter; and
a constant current source located between a positive power supply input of the operational amplifier and a first output of the two-wire output wherein the first output of the two-wire output carries signal and power for the charge amplifier circuit.

10. The charge amplifier circuit of claim 9, wherein the first low-pass filter is a passive 1-pole low-pass filter.

11. The charge amplifier circuit of claim 10, wherein the first low-pass filter comprises a resistor and a capacitor.

12. The charge amplifier circuit of claim 9, wherein the second low-pass filter is an active 2-pole low-pass filter.

13. The charge amplifier circuit of claim 12, wherein the second low-pass filter comprises two junction field effect transistors (JFET) connected in series with each other, three resistors, and two capacitors.

14. The charge amplifier circuit of claim 9, further comprising a first feedback circuit that provides direct current bias for a non-inverting input of the operational amplifier.

15. The charge amplifier circuit of claim 14, further comprising a second feedback circuit that provides direct current bias for an inverting input of the operational amplifier.

16. The charge amplifier circuit of claim 9, wherein a piezoelectric transducer is in electrical communication with the input of the charge amplifier circuit.

17. A charge amplifier circuit comprising:
an input and a two-wire output;
a charge amplifier comprising an operational amplifier and a feedback capacitor;
a first low-pass filter directly coupled to an output of the charge amplifier wherein the first low-pass filter is a 1-pole passive low-pass filter;
a second low-pass filter coupled to an output of the first low-pass filter by a decoupling capacitor wherein the second low pass filter is a 2-pole active low-pass filter;
an emitter follower directly coupled to an output of the second low-pass filter; and
a constant current source located between a positive power supply input of the operational amplifier and a first output of the two-wire output wherein the first output of the two-wire output carries signal and power for the charge amplifier circuit.

18. The charge amplifier circuit of claim 17, wherein a piezoelectric transducer is in electrical communication with the input of the charge amplifier circuit.

19. The charge amplifier circuit of claim 17, further comprising a first feedback circuit that provides direct current bias for a non-inverting input of the operational amplifier and a second feedback circuit that provides direct current bias for an inverting input of the operational amplifier.

* * * * *